United States Patent
Takebayashi

(10) Patent No.: US 11,205,584 B2
(45) Date of Patent: Dec. 21, 2021

(54) MEMBER FOR SEMICONDUCTOR MANUFACTURING APPARATUS AND METHOD FOR PRODUCING THE SAME

(71) Applicant: NGK INSULATORS, LTD., Nagoya (JP)

(72) Inventor: Hiroshi Takebayashi, Handa (JP)

(73) Assignee: NGK Insulators, Ltd., Nagoya (JP)

(*) Notice: Subject to any disclaimer, the term of this patent is extended or adjusted under 35 U.S.C. 154(b) by 0 days.

(21) Appl. No.: 15/719,708

(22) Filed: Sep. 29, 2017

(65) Prior Publication Data
US 2018/0108556 A1 Apr. 19, 2018

(30) Foreign Application Priority Data
Oct. 14, 2016 (JP) .............................. JP2016-202485

(51) Int. Cl.
*B32B 3/10* (2006.01)
*H01L 21/683* (2006.01)
(Continued)

(52) U.S. Cl.
CPC .......... *H01L 21/6833* (2013.01); *B32B 15/04* (2013.01); *B32B 37/10* (2013.01);
(Continued)

(58) Field of Classification Search
CPC .......... B32B 3/085; B32B 3/266; B32B 5/16; B32B 7/02; B32B 7/04; B32B 9/005;
(Continued)

(56) References Cited

U.S. PATENT DOCUMENTS

2003/0047589 A1* 3/2003 Fujii ................... H01L 21/6831
228/122.1
2004/0240142 A1* 12/2004 Fujii ................... H01L 21/6831
361/233
(Continued)

FOREIGN PATENT DOCUMENTS

JP 2006-196864 A1 7/2006
JP 2011-091096 A 5/2011
(Continued)

OTHER PUBLICATIONS

Japanese Office Action (with English translation), Japanese Application No. 2016-202485, dated Jun. 2, 2020 (7 pages).
(Continued)

*Primary Examiner* — Christopher M Polley
(74) *Attorney, Agent, or Firm* — Burr & Brown, PLLC

(57) ABSTRACT

A method for producing a member for a semiconductor manufacturing apparatus includes (a) a step of providing an electrostatic chuck, a supporting substrate, and a metal bonding material, the electrostatic chuck being made of a ceramic and having a form of a flat plate, the supporting substrate including a composite material having a difference in linear thermal expansion coefficient at 40 to 570° C. from the ceramic of $0.2 \times 10^{-6}$/K or less in absolute value, and (b) a step of interposing the metal bonding material between a concave face of the supporting substrate and a face of the electrostatic chuck opposite to a wafer mounting face, and thermocompression bonding the supporting substrate and the electrostatic chuck at a predetermined temperature to deform the electrostatic chuck to the shape of the concave face.

3 Claims, 4 Drawing Sheets

(51) Int. Cl.
*B32B 38/18* (2006.01)
*C04B 37/00* (2006.01)
*B32B 37/14* (2006.01)
*C04B 35/645* (2006.01)
*C04B 35/565* (2006.01)
*B32B 15/04* (2006.01)
*B32B 37/10* (2006.01)
*B32B 38/00* (2006.01)
*B32B 37/00* (2006.01)

(52) U.S. Cl.
CPC ........ *B32B 37/144* (2013.01); *B32B 38/1866* (2013.01); *C04B 35/565* (2013.01); *C04B 35/645* (2013.01); *C04B 37/006* (2013.01); *B32B 2037/0092* (2013.01); *B32B 2038/0076* (2013.01); *B32B 2309/105* (2013.01); *B32B 2457/14* (2013.01); *C04B 2235/3826* (2013.01); *C04B 2235/3839* (2013.01); *C04B 2235/3843* (2013.01); *C04B 2235/3891* (2013.01); *C04B 2235/404* (2013.01); *C04B 2235/428* (2013.01); *C04B 2235/5436* (2013.01); *C04B 2235/604* (2013.01); *C04B 2235/80* (2013.01); *C04B 2235/9607* (2013.01); *C04B 2237/121* (2013.01); *C04B 2237/126* (2013.01); *C04B 2237/128* (2013.01); *C04B 2237/343* (2013.01); *C04B 2237/365* (2013.01); *C04B 2237/704* (2013.01); *C04B 2237/76* (2013.01)

(58) Field of Classification Search
CPC ......... B32B 9/041; B32B 15/04; B32B 15/16; B32B 15/20; B32B 37/10; B32B 37/144; B32B 38/1866; B32B 2037/0092; B32B 2038/0076; B32B 2250/00; B32B 2250/105; B32B 2250/107; B32B 2307/732; B32B 2309/105; B32B 2457/14; C04B 35/565; C04B 35/645; C04B 37/006; C04B 2235/3826; C04B 2235/3839; C04B 2235/3843; C04B 2235/3891; C04B 2235/404; C04B 2235/428

See application file for complete search history.

(56) References Cited

U.S. PATENT DOCUMENTS

| | | |
|---|---|---|
| 2006/0169688 A1 | 8/2006 | Mori et al. |
| 2012/0211165 A1 | 8/2012 | Yoshikawa et al. |
| 2014/0272378 A1 | 9/2014 | Jindo et al. |
| 2014/0287245 A1 | 9/2014 | Jindo et al. |
| 2015/0036261 A1 | 2/2015 | Jindo et al. |
| 2015/0077895 A1* | 3/2015 | Jindo .................. F28F 21/086 361/234 |

FOREIGN PATENT DOCUMENTS

| | | |
|---|---|---|
| JP | 5628507 B2 | 11/2014 |
| JP | 5666748 B1 | 2/2015 |
| KR | 10-2012-0060889 A | 6/2012 |
| KR | 10-2014-0140112 A | 12/2014 |
| TW | 201506000 A | 2/2015 |
| WO | 2014/141974 A1 | 9/2014 |

OTHER PUBLICATIONS

Taiwanese Office Action (Application No. 106134515) dated Dec. 15, 2020.
Korean Office Action (with English translation), Korean Application No. 10-2017-0130159, dated Aug. 27, 2021 (11 pages).

* cited by examiner

MEMBER FOR SEMICONDUCTOR MANUFACTURING APPARATUS AND METHOD FOR PRODUCING THE SAME

BACKGROUND OF THE INVENTION

1. Field of the Invention

The present invention relates to a member for a semiconductor manufacturing apparatus and a method for producing the same.

2. Description of the Related Art

As known in the art, a semiconductor manufacturing apparatus has a component which includes an electrostatic chuck having a wafer mounting face and a buried electrostatic electrode, and a supporting substrate bonded to the face of the electrostatic chuck opposite to the wafer mounting face. Patent Literature 1 discloses a member for semiconductor manufacturing apparatus in which the face of a supporting substrate bonded to an electrostatic chuck is concave and the depth at the center of the concave face is $6.66 \times 10^{-5}$ to $8.33 \times 10^{-5}$ times the diameter of the concave face. Such a member for a semiconductor manufacturing apparatus is described to be capable of holding a wafer stably by virtue of the face of the supporting substrate bonded to the electrostatic chuck being rendered concave. In Patent Literature 1, the electrostatic chuck is composed of a ceramic member, and the supporting substrate is composed of, for example, an aluminum member or a stainless steel member. Here, the linear thermal expansion coefficient of alumina, which is a typical example of ceramics, is $7\text{-}8 \times 10^{-6}/K$, that of aluminum is about $23 \times 10^{-6}/K$, and that of SUS304, which is a typical example of stainless steel, is about $16 \times 10^{-6}/K$. The bonding of the electrostatic chuck to the concave face of the supporting substrate is accomplished by an adhesive which is caused to permeate the gap between the two members.

CITATION LIST

Patent Literature

PTL 1: JP 5628507 B

SUMMARY OF THE INVENTION

Unfortunately, because the electrostatic chuck and the supporting substrate in Patent Literature 1 have a large difference in linear thermal expansion coefficient, distortion sometimes occurs due to the difference between the linear thermal expansion coefficients during a step in which these members are heated and bonded. It is therefore difficult to reproduce the concave shape of the supporting substrate on the electrostatic chuck with good accuracy. Further, because an adhesive is caused to permeate the gap between the electrostatic chuck and the concave face of the supporting substrate (the gap is impregnated with a liquid adhesive), the bonding tends to result in a variation in the thickness of the adhesive layer. This fact also makes it difficult to reproduce the concave shape of the supporting substrate on the electrostatic chuck with good accuracy.

The present invention has been made to solve the problems discussed above. A main object of the invention is therefore to provide a member for a semiconductor manufacturing apparatus that includes a supporting substrate having a concave face and an electrostatic chuck reproducing the shape of the concave thereon with good accuracy.

A method for producing a member for a semiconductor manufacturing apparatus according to the present invention comprises (a) a step of providing an electrostatic chuck having a wafer mounting face, a supporting substrate having a concave face with the center being lower than the circumference, and a metal bonding material in the form of a flat plate, the electrostatic chuck being made of a ceramic and having a form of a flat plate, the supporting substrate including a composite material having a difference in linear thermal expansion coefficient at 40 to 570° C. from the ceramic of $0.2 \times 10^{-6}/K$ or less in absolute value; and (b) a step of interposing the metal bonding material between the concave face of the supporting substrate and a face of the electrostatic chuck opposite to the wafer mounting face, and thermocompression bonding the supporting substrate and the electrostatic chuck at a temperature not more than the solidus temperature of the metal bonding material to deform the electrostatic chuck to the shape of the concave face.

In the production method, the difference in linear thermal expansion coefficient at 40 to 570° C. is not more than $0.2 \times 10^{-5}/K$ in absolute value between the ceramic which forms the electrostatic chuck and the composite material which forms the supporting substrate. This configuration eliminates of highly reduces the risk that a distortion occurs during thermal bonding of the two members due to the difference between their linear thermal expansion coefficients. Further, the supporting substrate and the electrostatic chuck are bonded together in such a manner that the metal bonding material is interposed between the concave face of the supporting substrate and the face of the electrostatic chuck opposite to the wafer mounting face, and thermocompression bonding is performed at a temperature that is not more than the solidus temperature of the metal bonding material. This manner of bonding reduces the probability that a variation will be generated in the thickness of the metal bonding layer. By virtue of the configurations described above, the electrostatic chuck can reproduce the shape of the concave face of the supporting substrate with good accuracy.

The thermocompression bonding is also called thermal compression bonding (TCB).

In the method for producing a member for a semiconductor manufacturing apparatus according to the present invention, the concave face is preferably a spherically concave face. Because the curvature of such a concave face is identical throughout the face, a load applied during bonding can be uniformly distributed and the metal bonding material will attain a uniform bonding strength.

In the method for producing a member for a semiconductor manufacturing apparatus according to the present invention, the depth at the lowest point in the concave face is preferably 1 to 100 μm, and more preferably 40 to 60 μm. The production method of the present invention can bond the electrostatic chuck and the supporting substrate with a sufficient bonding strength even when the depth at the lowest point is relatively large.

In the method for producing a member for a semiconductor manufacturing apparatus according to the present invention, the ceramic is preferably alumina, the composite material is preferably a material containing 37 to 60 mass % silicon carbide and amounts, each smaller than the amount in mass % of the silicon carbide, of titanium silicide, titanium silicon carbide and titanium carbide, and the metal bonding material preferably includes an Al—Si—Mg material or an Al—Mg material. Such a composite material has a very small difference in linear thermal expansion coefficient from alumina, and is therefore suitable as the supporting substrate material. The metal bonding material including an Al—Si—Mg material or an Al—Mg material is suited to effect thermocompression bonding. The Al—Si—Mg material or the Al—Mg material is a material based on Al. An example Al—Si—Mg material is one which contains 9 to 12 mass % Si, 1 to 2 mass % Mg, and the balance of Al.

In the method for producing a member for a semiconductor manufacturing apparatus according to the present invention, the thickness of the electrostatic chuck is preferably 2 mm or more and 5 mm or less, and the thickness of the supporting substrate is preferably 7 mm or more and 15 mm or less. When the electrostatic chuck is being bonded to the concave face of the supporting substrate, the electrostatic chuck exerts a force which tries to restore the flat plate form. By designing the electrostatic chuck and the supporting substrate to have thicknesses in the above ranges, it becomes possible to bond easily the electrostatic chuck to the supporting substrate while ensuring that the electrostatic chuck is deformed to the shape of the concave face even in the presence of such a restoring force.

A member for a semiconductor manufacturing apparatus according to the present invention comprises an electrostatic chuck having a wafer mounting face, the electrostatic chuck being made of a ceramic;

a supporting substrate having a concave face with the center being lower than the circumference, the supporting substrate including a composite material having a difference in linear thermal expansion coefficient at 40 to 570° C. from the ceramic of $0.2 \times 10^{-6}$/K or less in absolute value; and a metal bonding layer disposed so as to bond a face of the electrostatic chuck opposite to the wafer mounting face to the concave face of the supporting substrate while the electrostatic chuck is deformed to the shape of the concave face.

In the member for a semiconductor manufacturing apparatus, the difference in linear thermal expansion coefficient at 40 to 570° C. is not more than $0.2 \times 10^{-6}$/K in absolute value between the ceramic which forms the electrostatic chuck and the composite material which forms the supporting substrate, and the concave face of the supporting substrate and the electrostatic chuck are bonded via the metal bonding layer. These configurations allow the electrostatic chuck to reproduce the shape of the concave face of the supporting substrate with good accuracy. Because the wafer mounting face of the electrostatic chuck is rendered concave, the wafer mounting face can hold a wafer stably as compared to when the wafer mounting face is convex.

In the member for a semiconductor manufacturing apparatus according to the present invention, the concave face is preferably a spherically concave face. Further, the depth at the lowest point in the concave face is preferably 40 to 60 μm. Furthermore, the ceramic is preferably alumina, the composite material is preferably a material containing 37 to 60 mass % silicon carbide and amounts, each smaller than the amount in mass % of the silicon carbide, of titanium silicide, titanium silicon carbide and titanium carbide, and the metal bonding layer preferably includes an Al—Si—Mg material or an Al—Mg material. It is also preferable that the thickness of the electrostatic chuck be 2 mm or more and 5 mm or less, and the thickness of the supporting substrate be 7 mm or more and 15 mm or less.

DETAILED DESCRIPTION OF THE INVENTION

Figure 1:
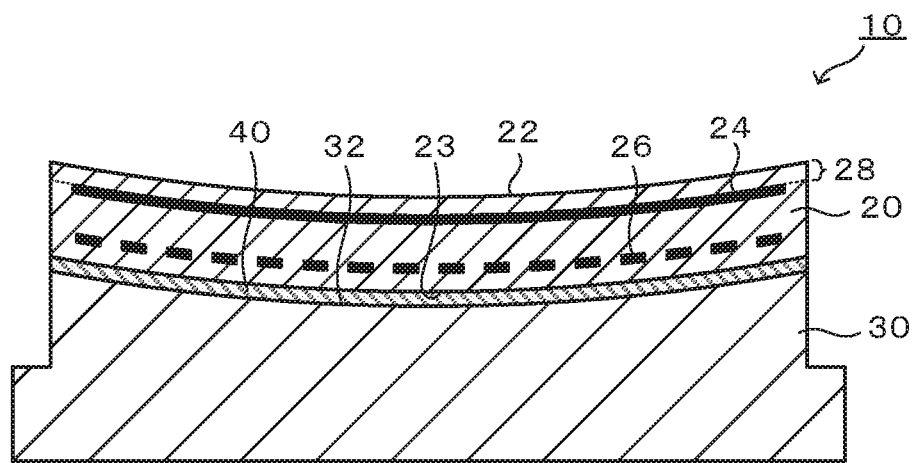
FIG. 1 is a sectional view of the member for a semiconductor manufacturing apparatus 10.
Figure 2:
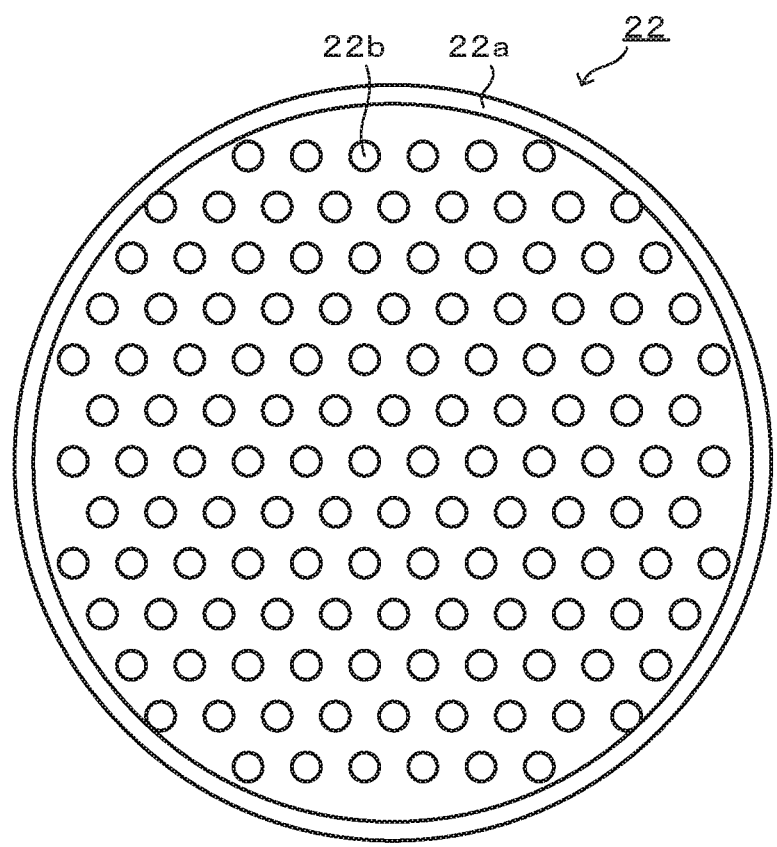
FIG. 2 is a plan view of a wafer mounting face 22.

Hereinbelow, a member for a semiconductor manufacturing apparatus 10 according to the present embodiment will be described. FIG. 1 is a sectional view of the member for a semiconductor manufacturing apparatus 10 (a view of a cross section cut by a vertical plane through the middle of the component 10). FIG. 2 is a plan view of a wafer mounting face 22.

The member for a semiconductor manufacturing apparatus 10 includes an electrostatic chuck 20, supporting substrate 30 and a metal bonding layer 40.

The electrostatic chuck 20 is an alumina plate in the form of a disk which is smaller in outer diameter than a silicon wafer to be plasma treated, and includes an electrostatic electrode 24 and a heater electrode 26. The diameter of the electrostatic chuck 20, although not particularly limited, may be, for example, 250 to 350 mm. The thickness of the electrostatic chuck 20 is not particularly limited, but is preferably 2 mm or more and 5 mm or less. The upper face of the electrostatic chuck 20 is a wafer mounting face 22. In the wafer mounting face 22, as illustrated in FIG. 2, a sealing band 22a is disposed along the outer edge, and a plurality of embossed portions 22b are disposed in the entirety of the face. The height of the sealing band 22a and the embossed portions 22b is several μm to several tens of μm. The electrostatic electrode 24 is a plane electrode through which a direct voltage can be applied by an external power supply via a feed terminal that is not shown. A portion of the alumina plate between the wafer mounting face 22 and the electrostatic electrode 24 serves as a dielectric layer 28. When a direct voltage is applied to the electrostatic electrode 24, a wafer mounted on the wafer mounting face 22 adsorbed and clamped to the wafer mounting face 22 by Coulomb's force. When the application of a direct voltage is suspended, the wafer is released and declamped from the wafer mounting face 22. For example, the heater electrode 26 is patterned as a continuous line so that it is distributed throughout the entire face of the electrostatic chuck 20. The heater electrode 26, when a voltage is applied thereto, becomes hot and heats the wafer. The electrostatic electrode 24 and the heater electrode 26 are both disposed in parallel with the wafer mounting face 22. The term "parallel" means not only a perfect parallel relationship but also an arrangement which is not perfectly parallel but is directed in substantially the same direction within tolerance limits (the same applies hereinafter).

The supporting substrate 30 is a disk-shaped plate of a composite material which has a step in the outer periphery. The upper face of the supporting substrate 30 is a concave face 32 in which the outline is a circle with an equal or slightly larger outer diameter than the electrostatic chuck 20 and the center is lower than the circumference. The composite material contains Si, C and Ti, and has a difference in linear thermal expansion coefficient at 40 to 570° C. from alumina of $0.2 \times 10^{-6}$/K or less in absolute value. The composite material preferably contains 37 to 60 mass % silicon carbide particles and amounts, each smaller than the amount in mass % of the silicon carbide particles, of titanium silicide, titanium silicon carbide and titanium carbide. The contents may be determined in a simplified manner by obtaining an X-ray diffraction pattern of the composite material and analyzing the data with an analysis software. Examples of titanium silicides include $TiSi_2$, $TiSi$, $Ti_5Si_4$ and $Ti_5Si_3$, with $TiSi_2$ being preferable. A preferred titanium silicon carbide is $Ti_3SiC_2$ (TSC), and a preferred titanium carbide is TiC. The mass % of titanium carbide is preferably lower than the mass % of titanium silicide and the mass % of titanium silicon carbide. The mass % of titanium silicide is preferably higher than the mass % of titanium silicon carbide. In other words, it is preferable that the mass % be highest for silicon carbide and decrease in the order of titanium silicide, titanium silicon carbide and titanium carbide. For example, the material may contain 37 to 60 mass % silicon carbide, 31 to 41 mass % titanium silicide, 5 to 25 mass % titanium silicon carbide, and 1 to 4 mass % titanium carbide. The open porosity of the composite material is preferably 1% or less. The open porosity may be measured by the Archimedes method using pure water as a medium. The details of such a composite material are described in JP 5666748 B. The concave face 32 may be, for example, a mortar-like concave face or a spherically concave face, and is preferably a spherically concave face. In the concave face 32, the depth at the lowest point is preferably 1 to 100 μm, and more preferably 40 to 60 μm. The thickness of the supporting substrate 30 is not particularly limited, but is preferably, for example, 7 mm or more and 15 mm or less. A cooling substrate that is not shown may be bonded to the face of the supporting substrate 30 opposite to the concave face 32, The cooling substrate is composed of, for example, aluminum or aluminum alloy, and may have a refrigerant channel inside the substrate.

The metal bonding layer 40 bonds a face 23 of the electrostatic chuck 20 opposite to the wafer mounting face 22, to the concave face of the supporting substrate 30. This layer includes an Al—Si—Mg material or an Al—Mg material. The electrostatic chuck 20 is bonded to the concave face 32 by the metal bonding layer 40 while being deformed to the shape of the concave face 32, namely, to a concave shape. As will be described later, the metal bonding layer 40 is formed by TCB. The TCB bonding strength can surpass the strength of the force with which the electrostatic chuck 20 deformed to a concave shape tries to restore the original flat plate form. Thus, no separation occurs in the metal bonding layer 40. The deformation of the electrostatic chuck 20 into a concave shape is accompanied by a similar concave deformation of the wafer mounting face 22 and the electrostatic electrode 24 of the electrostatic chuck 20. As a result, the thickness of the dielectric layer 28 is constant throughout the plane. The thickness of the metal bonding layer 40 is not particularly limited, but is preferably 1 to 300 μm, and more preferably 50 to 150 μm. The outer periphery of the metal bonding layer 40 preferably does not extend beyond the outer diameter of the electrostatic chuck 20.

In the member for a semiconductor manufacturing apparatus 10, a gas supply hole through which He gas is supplied to the backside of a wafer, or a lift pin insertion hole for the insertion of a lift Din which lifts a wafer from the wafer mounting face 22 may be formed to penetrate through the member for a semiconductor manufacturing apparatus 10 in a vertical direction.

Next, an example of the use of the member for a semiconductor manufacturing apparatus 10 will be described. First, the member for a semiconductor manufacturing apparatus 10 is installed in a vacuum chamber that is not shown, and a wafer is mounted on the wafer mounting face 22. The vacuum chamber is then evacuated by a vacuum pump to a prescribed degree of vacuum, and a direct voltage is applied to the electrostatic electrode 24 to generate Coulomb's force, thereby adsorbing and clamping the wafer to the wafer mounting face 22. Because the wafer mounting face 22 is concave, the wafer is held to the wafer mounting face 22 stably as compared to when the wafer mounting face 22 is convex. Next, a reactive gas atmosphere at a prescribed pressure (for example, several tens to several hundreds of Pa) is created in the vacuum chamber, and plasma is generated. The surface of the wafer is etched using the plasma generated. The power supplied to the heater electrode 26 is controlled by a controller that is not shown, so that the temperature of the wafer will be a prescribed target temperature.

Figure 4A:
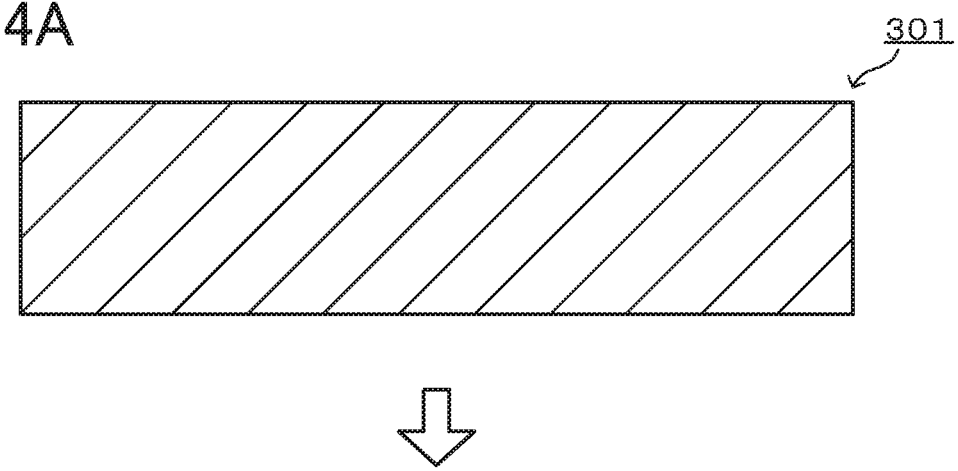
FIGS. 4A-4B are process drawings in the production of a supporting substrate 30.
Figure 4B:
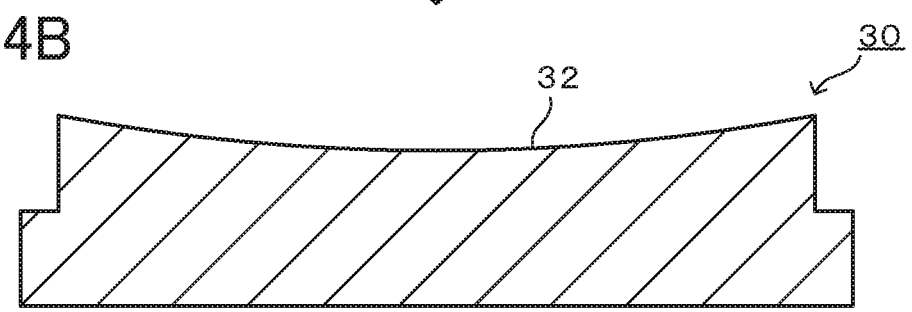
Figure 5A:
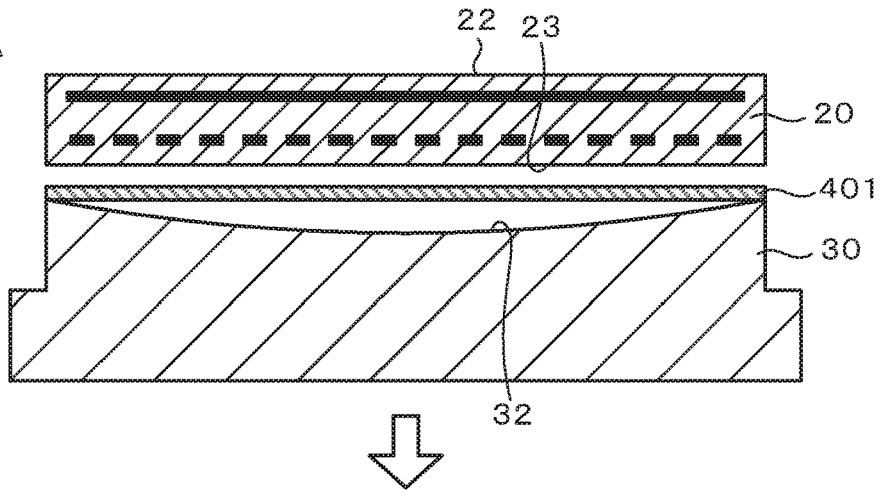
FIGS. 5A-5D are a process drawings in the production of a member for a semiconductor manufacturing apparatus 10.
Figure 5B:
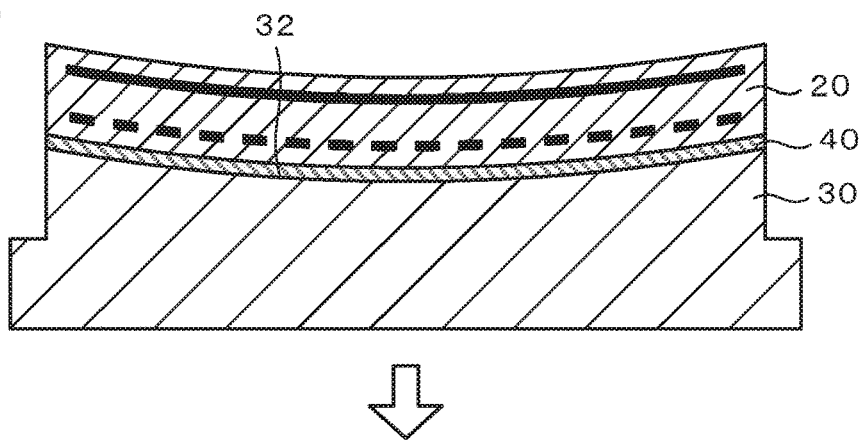
Figure 5C:
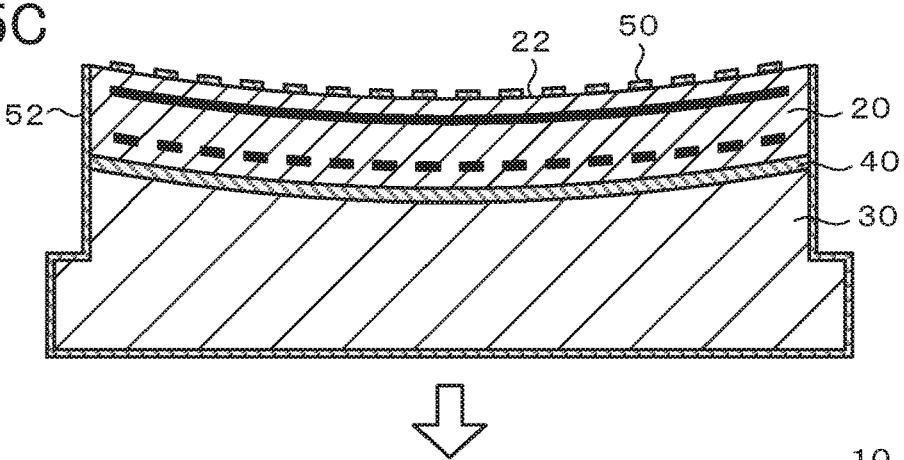
Figure 5D:
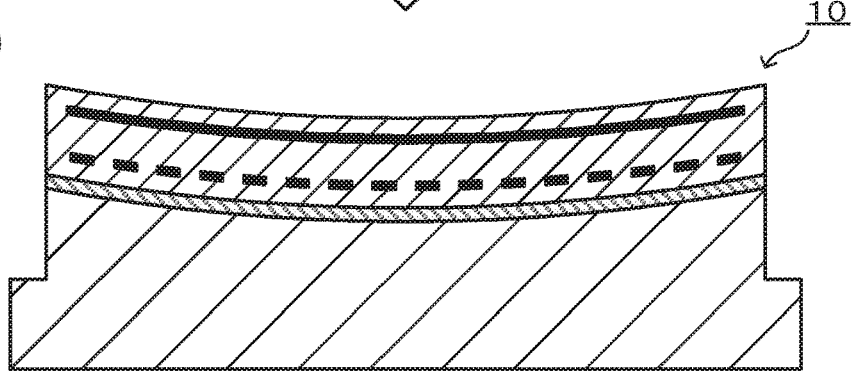

Next, an example production of a member for a semiconductor manufacturing apparatus 10 will be described. FIGS. 3A-3D are process drawings in the production of an electrostatic chuck 20. FIGS. 4A-4B are process drawings in the production of a supporting substrate 30. FIGS. 5A-5D are process drawings in the production of a member for a semiconductor manufacturing apparatus 10.

Figure 3A:
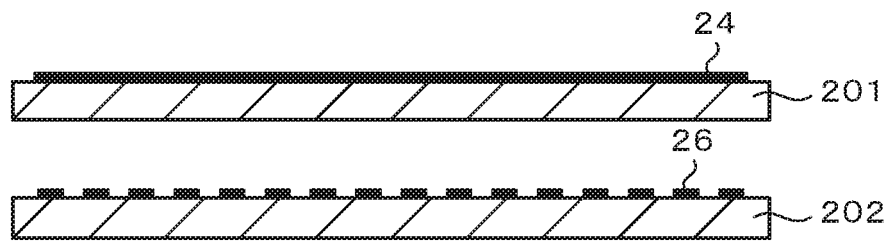
FIGS. 3A-3E are process drawings in the production of an electrostatic chuck 20.
Figure 3B:
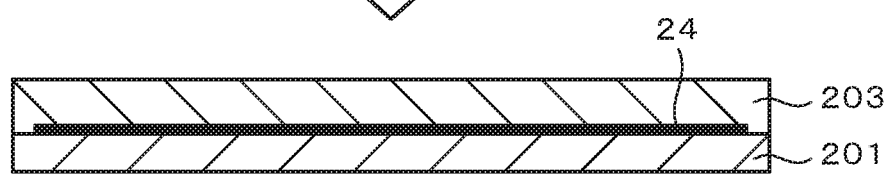
Figure 3C:
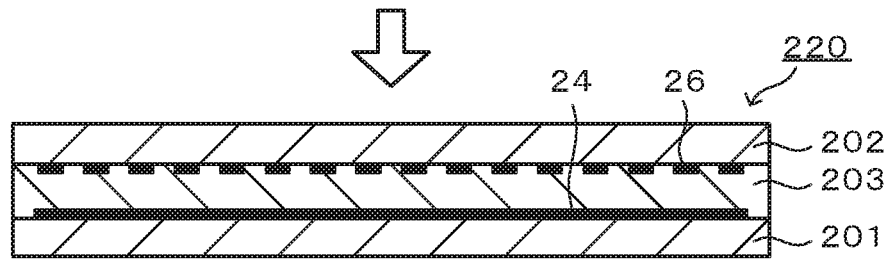
Figure 3D:
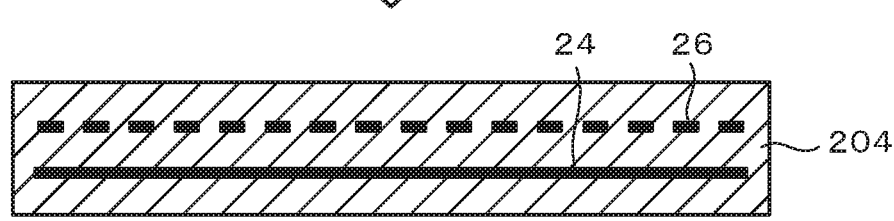
Figure 3E:
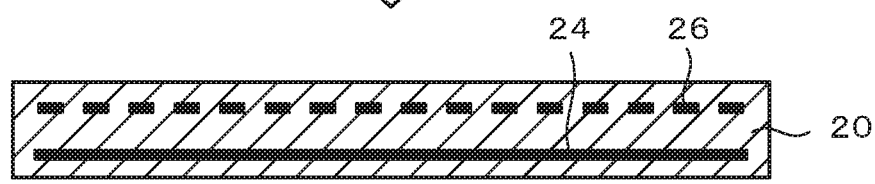

An electrostatic chuck 20 may be produced as follows. First and second green sheets 201, 202 made of alumina in the form of a disk are provided. An electrostatic electrode 24 is formed on one surface of the first green sheet 201, and a heater electrode 26 is formed on one surface of the second green sheet 202 (see FIG. 3A). Examples of the electrode forming methods include screen printing, PVD, CVD and plating. Next, another alumina green sheet (a third green sheet 203) is stacked on the face of the first green sheet 201 on which the electrostatic electrode 24 has been formed (see FIG. 3B), and the second green sheet 202 is stacked thereon so that the heater electrode 26 will be placed in contact with the third green sheet 203, thereby preparing a stack 220 (see FIG. 3C). Alternatively, although not illustrated, a stack 220 may be prepared by placing the first green sheet 201 into a mold so that the electrostatic electrode 24 will face upward, pouring pelletized alumina granules onto the face having the electrostatic electrode 24 to a prescribed thickness, stacking the second green sheet 202 thereon so that the heater electrode 26 will be placed in contact with the layer of the alumina granules, and pressing the layers together. Next, the stack 220 is calcined by a hot press method to give a ceramic sintered body 204 in which the electrostatic electrode 24 and the heater electrode 26 are buried (see FIG. 3D). The both faces of the ceramic sintered body 204 are subjected to a processing such as grinding or blasting to control the shape and the thickness. An electrostatic chuck 20 in the form of a flat plate is thus obtained (see FIG. 3E). In the electrostatic chuck 20, a wafer mounting face 22, a face 23 opposite thereto, and the electrostatic electrode 24 are parallel to one another. The alumina green sheets may be replaced by alumina compacts fabricated by a casting method. Alternatively, the first and second green sheets 201, 202 may be replaced by alumina sintered bodies, or the third green sheet 203 may be replaced by an alumina sintered body. Specific conditions in the production of the electrostatic chuck 20 may be determined with reference to the conditions described in, for example, JP 2006-196864 A.

A supporting substrate 30 may be produced as follows. First, a disk member 301 is fabricated from a composite material (see FIG. 4A). Here, a powder mixture is prepared which contains 39 to 51 mass % of silicon carbide ingredient particles having an average particle size of 10 μm or more and 25 μm or less and contains one or more ingredients selected so that Ti and Si will be contained in the material, and which has a mass ratio with respect to Si and Ti, Si/(Si+Ti), derived from the ingredient except silicon carbide, of 0.26 to 0.54. The ingredients may be, for example, silicon carbide, metallic Si and metallic Ti. In this case, the mixing preferably involves 39 to 51 mass % silicon carbide, 16 to 24 mass % metallic Si, and 26 to 43 mass % metallic Ti. Next, the powder mixture obtained is shaped into a compact in the form of a disk by uniaxial pressing. The compact is sintered by hot pressing in an inert atmosphere at 1370 to 1460° C. to give a disk member made of the composite material. The pressure in the hot pressing is set to, for example, 50 to 300 kgf/cm$^2$. Next, the disk member 301 obtained is processed by grinding or the like so that the top face will define a desired concave face 32 and the lateral face will have a step. A supporting substrate 30 is thus obtained (see FIG. 4B). Because the linear thermal expansion coefficient of alumina at 40 to 570° C. is 7.7×10$^{-6}$/K, the supporting substrate 30 used here is one having a linear thermal expansion coefficient at 40 to 570° C. of 7.5-7.9×10$^{-6}$/K. Specific conditions in the production of the supporting substrate 30 may be determined with reference to the conditions described in, for example, JP 5666748 B.

A member for a semiconductor manufacturing apparatus 10 may be produced as follows. A metal bonding material 401 in the form of a flat plate is placed on the concave face 32 of the supporting substrate 30, and the electrostatic chuck 20 in the form of a flat plate is placed thereon so that the face 23 opposite to the wafer mounting face 22 will be in contact with the metal bonding material 401 (see FIG. 5A). Consequently, the metal bonding material 401 is interposed between the concave face 32 of the supporting substrate 30 and the face 23 of the electrostatic chuck 20 in the form of a flat plate. Next, the supporting substrate 30 and the electrostatic chuck 20 are thermocompression bonded (TCB) at a temperature that is not more than the solidus temperature of the metal bonding material 401 (for example, at a temperature between the solidus temperature minus 20° C. and the solidus temperature inclusive) so as to deform the electrostatic chuck 20 to the shape of the concave face 32 (see FIG. 5E). Consequently, the metal bonding material 401 forms a metal bonding layer 40. The metal bonding material 401 may be an Al—Mg bonding material or an Al—Si—Mg bonding material. When, for example, TCB is effected using an Al—Si—Mg bonding material (containing 88.5 wt % Al, 10 wt % Si and 1.5 wt % Mg and having a solidus temperature of about 560° C.), a pressure of 0.5 to 2.0 kg/mm$^2$ (for example, 1.5 kg/mm$^2$) is applied to the electrostatic chuck 20 for several hours in a vacuum atmosphere while performing heating at 540 to 560° C. (for example, 550° C.). The metal bonding material 401 that is used is preferably one having a thickness of about 100 µm. Next, an emboss pattern mask 50 is attached to the wafer mounting face 22 of the electrostatic chuck 20, and blasting is performed by ejecting a blast media that is not shown to the wafer mounting face 22 (see FIG. 5C). During this process, the lateral sides of the electrostatic chuck 20, the metal bonding layer 40 and the supporting substrate 30 are covered with a curing mask 52 against the influence of the blasting. Some example blast media materials are SiC and Al$_2$O$_3$. The blasting results in a sealing band 22a and embossed portions 22b on the wafer mounting face 22. Thereafter, the curing mask 52 is removed. A member for a semiconductor manufacturing apparatus 10 is thus obtained (see FIG. 5D).

In the method for producing the member for a semiconductor manufacturing apparatus 10 described above, the difference in linear thermal expansion coefficient at 40 to 570° C. is 0.2×10$^{-6}$/K or less in absolute value between alumina which forms the electrostatic chuck 20 and the composite material which forms the supporting substrate 30. Thus, these two members may be bonded together by TCB without or with very little distortion caused by the difference between their linear thermal expansion coefficients. Further, the supporting substrate 30 and the electrostatic chuck 20 are bonded together in such a manner that the metal bonding material 401 composed of an Al—Si—Mg or Al—Mg material is interposed between the concave face 32 and the face 23 opposite to the wafer mounting face 22 of the electrostatic chuck 20, and TCB is performed at a temperature that is not more than the solidus temperature of the metal bonding material 401. This manner of bonding reduces the probability that a variation will be generated in the thickness of the metal bonding layer 40. By virtue of the configurations described above, the electrostatic chuck 20 can reproduce the shape of the concave face of the supporting substrate 30 with good accuracy.

The concave face 32 of the supporting substrate 30 is a spherically concave face. Because the curvature of such a concave face 32 is identical throughout the face, a load applied during bonding can be uniformly distributed and the metal bonding material 401 will attain a uniform bonding strength.

Further, the production method described above ensures that the electrostatic chuck 20 and the supporting substrate 30 can be bonded together with a sufficient bonding strength even when the depth at the lowest point of the concave face 32 of the supporting substrate 30 is relatively large.

Furthermore, the composite material used as the supporting substrate 30 contains 37 to 60 mass % silicon carbide and amounts, each smaller than the amount in mass % of the silicon carbide, of titanium silicide, titanium silicon carbide and titanium carbide, and has a very small difference in linear thermal expansion coefficient from alumina. Such a material is suited as the supporting substrate 30.

Still further, the advantageous effects described below can be obtained by controlling the thickness of the electrostatic chuck 20 to 2 mm or more and 5 mm or less, and the thickness of the supporting substrate 30 to 7 mm or more and 15 mm or less. When the electrostatic chuck 20 is being bonded to the concave face 32 of the supporting substrate 30, the electrostatic chuck 20 exerts a force which tries to restore the flat plate form. By designing the electrostatic chuck 20 to have a thickness of 2 mm or more and 5 mm or less and the supporting substrate 30 to have a thickness of 7 mm or more and 15 mm or less, it becomes possible to bond easily the electrostatic chuck 20 to the supporting substrate 30 while ensuring that the electrostatic chuck 20 is deformed to the shape of the concave face 32 even in the presence of such a restoring force.

It is needless to mention that the scope of the present invention is not limited to the embodiments discussed above, and the invention may be carried out in various embodiments without departing from the technical scope of the present invention.

For example, while the embodiments discussed above have illustrated the electrostatic electrode 24 and the heater electrode 26 as being buried in the electrostatic chuck 20, the heater electrode 26 may be omitted.

While the embodiments discussed above have illustrated the concave face 32 of the supporting substrate 30 as being a spherical concave, the concave face may be a mortar-like concave face. In a mortar-like concave face, the shape of the concave space is conical. The advantageous effects of the invention can be attained even with such a configuration.

There is, however, a risk that the bonding strength at the central portion of the mortar-like concave face is lowered compared to other portions. The reason for this is because the central portion of the mortar-like concave face requires a high load at the time of bonding but TCB applies a load in a uniformly distributed manner and tends to fail to apply a sufficient load to the central portion.

While in the aforementioned embodiments the electrostatic chuck 20 is composed of alumina and the supporting substrate 30 of a composite material containing Si, C and Ti, the combination of the materials is not particularly limited thereto as long as the difference in linear thermal expansion coefficient at 40 to 570° C. is not more than $0.2 \times 10^{-6}$/K between the ceramic of the electrostatic chuck 20 and the composite material of the supporting substrate 30.

The present application claims priority from Japanese Patent Application No. 2016-202485 filed on Oct. 14, 2016, the entire contents of which are incorporated herein by reference.

What is claimed is:

1. A member for a semiconductor manufacturing apparatus comprising:
   an electrostatic chuck having a wafer mounting face, the electrostatic chuck being made of a ceramic;
   a supporting substrate having a spherically concave face with the center being lower than the circumference, the supporting substrate, is only a single substrate made of a solid material including a composite material having a difference in linear thermal expansion coefficient at 40 to 570° C. from the ceramic of $0.2 \times 10^{-6}$/K or less in absolute value; and
   only a single metal bonding layer, which has a thickness of about 100 μm, disposed so as to bond a face of the electrostatic chuck opposite to the wafer mounting face to the concave face of the supporting substrate while the electrostatic chuck is deformed to the shape of the concave face, wherein the single metal bonding layer is in direct contact with both the face of the electrostatic chuck opposite to the wafer mounting face and the concave face of the supporting substrate, such that the single metal bonding layer is configured to have a uniform thickness between an entirety of the face of the electrostatic chuck opposite to the wafer mounting face and an entirety of the concave face of the supporting substrate, and the depth at the lowest point in the concave face is 40 to 60 μm.

2. The member for a semiconductor manufacturing apparatus according to claim 1,
   wherein the ceramic is alumina,
   the composite material is a material containing 37 to 60 mass % silicon carbide and amounts, each smaller than the amount in mass % of the silicon carbide, of titanium silicide, titanium silicon carbide and titanium carbide, and
   the single metal bonding layer includes an Al-Si-Mg material or an Al-Mg material.

3. The member for a semiconductor manufacturing apparatus according to claim 1, wherein the thickness of the electrostatic chuck is 2 mm or more and 5 mm or less, and the thickness of the supporting substrate is 7 mm or more and 15 mm or less.

* * * * *